United States Patent

Gleim et al.

[11] Patent Number: 5,847,592
[45] Date of Patent: Dec. 8, 1998

[54] DRIVING CIRCUIT WITH SEVERAL SENSORS

[75] Inventors: Günter Gleim; Friedrich Heizmann; Bernd Rekia, all of Villingen-Schwenningen, Germany

[73] Assignee: Deutsche Thomson-Brandt GmbH, Villingen-Schewenningen, Germany

[21] Appl. No.: 617,765

[22] PCT Filed: Sep. 13, 1994

[86] PCT No.: PCT/EP94/03050

§ 371 Date: Sep. 20, 1996

§ 102(e) Date: Sep. 20, 1996

[87] PCT Pub. No.: WO95/08869

PCT Pub. Date: Mar. 30, 1995

[30] Foreign Application Priority Data

| Sep. 20, 1993 | [DE] | Germany | 43 31 742.1 |
| Sep. 30, 1993 | [DE] | Germany | 43 33 465.2 |
| Oct. 11, 1993 | [DE] | Germany | 43 34 480.1 |
| Nov. 24, 1993 | [DE] | Germany | 43 40 086.8 |

[51] Int. Cl.$^6$ ............................................. H03K 17/62
[52] U.S. Cl. .................... 327/403; 327/71; 327/205
[58] Field of Search .................. 327/68, 71, 72, 327/76, 205, 403

[56] References Cited

U.S. PATENT DOCUMENTS

| 4,157,509 | 6/1979 | Zielinski | 327/68 |
| 4,259,662 | 3/1981 | Yoshida | 340/146.3 |
| 4,268,764 | 5/1981 | Eckert | 327/79 |
| 4,283,664 | 8/1981 | Ebert | 318/138 |
| 4,354,145 | 10/1982 | Janssen | 318/254 |
| 5,107,135 | 4/1992 | Hagita | 307/261 |
| 5,182,500 | 1/1993 | Shimada | 318/254 |

FOREIGN PATENT DOCUMENTS

| 3133703 | 3/1983 | Germany . |
| 61-224900 | 3/1987 | Japan . |
| 51-001561 | 8/1993 | Japan . |

*Primary Examiner*—David C. Nelms
*Assistant Examiner*—Hoai Ho
*Attorney, Agent, or Firm*—Joseph S. Tripoli; Frederick A. Wein

[57] ABSTRACT

Control circuit for producing output voltages from a plurality of sensor signals, wherein each of the sensor signals are identical and mutually phase shifted. The control circuit comprises a plurality of comparators for producing the output voltages, wherein each comparator is respectively supplied with one of the sensor signals and with an amount of hysteresis which depends on the amplitude of one or more of the respective other sensor signals. The control circuit further comprises electronic circuitry for deriving the respective amount of comparator hysteresis for each of the comparators from the amplitude of one or more of the respective other sensor signals.

8 Claims, 9 Drawing Sheets

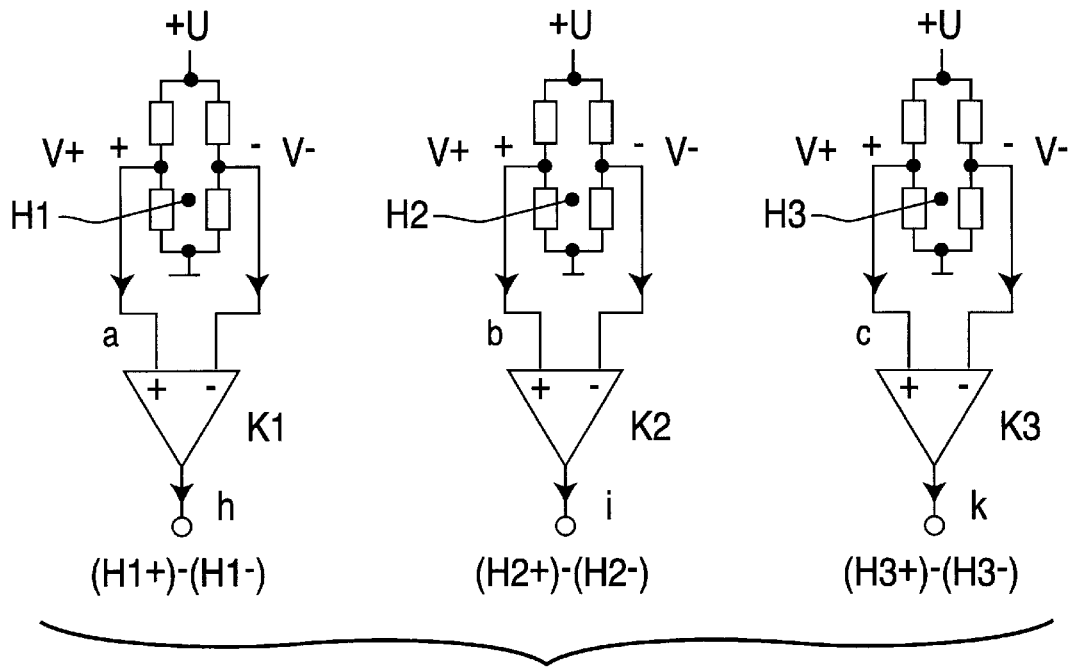
FIG. 4
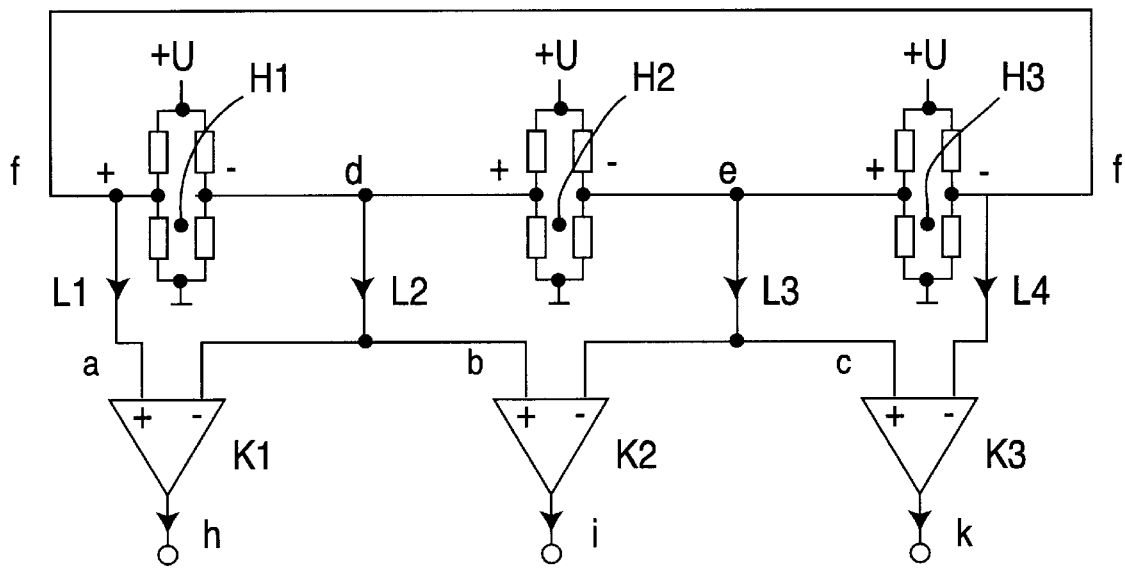
FIG. 5
FIG. 6
d: [ ( H1-)+( H2+ ) ] /2
e: [ ( H2-)+( H3+ ) ] /2
f: [ ( H3-)+( H1+ ) ] /2
h: [ ( H3-)+( H1+ ) ] /2 - [ ( H1- )+( H2+ ) ] /2
i: [ ( H1-)+( H2+ ) ] /2 - [ ( H2- )+(H3+ ) ] /2
k: [ ( H2-)+( H3+ ) ] /2 - [ ( H3- )+(H1+ ) ] /2

DRIVING CIRCUIT WITH SEVERAL SENSORS

FIELD OF THE INVENTION

The invention is based on a control circuit having a plurality of sensors producing mutually phase shifted sensor signals. Such a circuit has been disclosed in EP-B1-0 351 697 and, for example, is used for commutation or speed regulation of the capstan motor in a video recorder.

BACKGROUND OF THE INVENTION

Hall elements can be used as sensors for the respective angular position of the rotor. These Hall elements have a large output-voltage range. The output voltage of such an element has interference superimposed on it, however, which is directly magnetically pronounced, inter alia, by the motor coils. Taking account of all the tolerances, such interference is greater than the smallest signal voltage. For this reason, a simple solution, such as filtering out the interference by means of a threshold voltage or hysteresis, cannot be used or can be used only to a limited extent. Even an AGC circuit cannot be used, since the motor must start correctly and immediately from rest. An AGC circuit would need a number of oscillations in the input signal in order to stabilize itself.

SUMMARY OF THE INVENTION

The invention is based on the object of implementing a circuit which is even able to suppress the said interference, and also retains this capability over an unlimited time. When used on a motor, the circuit is also intended to be able to suppress interference when the motor is stationary.

This object is achieved by the invention specified in the independent claims. Advantageous developments of the invention are specified in the subclaims.

The invention is based on the following considerations and knowledge. As is known, the sensor signal which is supplied to the comparator is in the vicinity of 0 at the point in time at which the comparator for a sensor signal in each case responds before a sensor, that is to say its output voltage changes between the two logic values "0" and "1". The invention now makes use of the fact that the sensor signals of the other sensors have a significant amplitude, because of the identical nature and the constant phase shift. For example, in the case of an arrangement having three sensors, the sensor signals of the other sensors will in each case have an amplitude in the region of 86% for a symmetrical rotating field with a 120° offset. The sensor signals of the other sensors are thus in each case used for the change in the hysteresis in the case of the comparator for one sensor signal.

The sensor signals of all the sensors are preferably supplied to an OR stage which responds to the positive and/or negative peak values of the sensor signals and whose output voltage is applied to the inputs of the comparators, which inputs determine the hysteresis. The OR stage thus always supplies the sensor signal having the greatest amplitude in this case.

It is also possible in this arrangement to provide a first OR stage for the positive peak values and a second OR stage for the negative peak values of the sensor signals, and a changeover switch which is controlled by the output voltage of the comparator and switches the input of the comparator over between the outputs of the two OR stages. In consequence, it is possible to achieve hysteresis which is symmetrical with respect to the zero line, and thus improved suppression of the interference.

The sensor signal coming from a sensor and the output voltage of the OR stage are preferably respectively applied to the two inputs of a comparator. In this case, a switch, which is opened and closed alternately by the output voltage of the comparator, is in each case connected between the output of the OR stage and the associated input of the comparator.

In the case of a development of the invention, a second OR stage for a second OR process can also be provided after the said first OR stage. The output voltage of the OR stage of a first polarity and those half-cycles of the output voltages of the sensors which are of the opposite polarity in comparison therewith but have been transferred to the first polarity are now applied to this second OR stage. A relatively large number of voltage peaks are now available overall because the voltage peaks from the first OR stage and the voltage peaks of opposite polarity now alternate.

The sensors are preferably Hall elements which produce the characteristic signals because of a magnetic field. However, the invention can also be applied to other types of sensors, generators and signal sources.

BRIEF DESCRIPTION OF DRAWINGS

The invention is explained in the following text with reference to the drawing, in which:

FIGS. 3–21 show block diagrams and its associated signal waveforms of the present invention.

Figure 1:
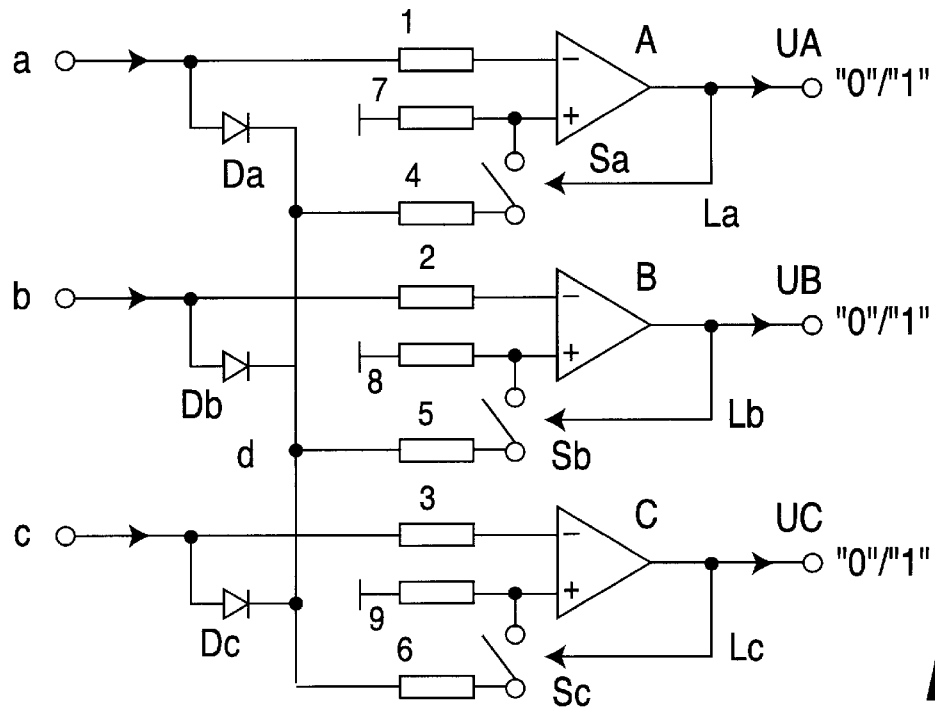
FIG. 1 shows a block diagram for the evaluation of the signals produced by the sensors using the solution according to the invention.
Figure 2:
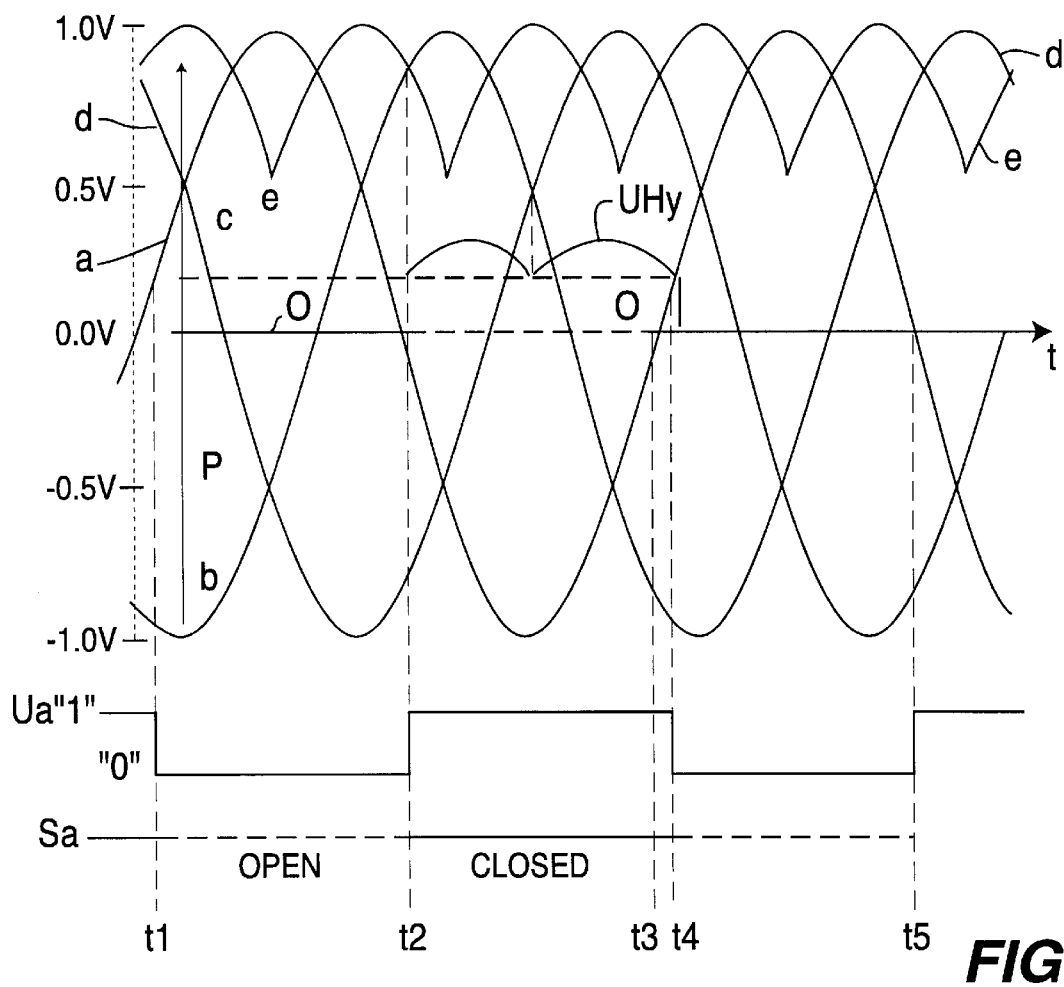
FIG. 2 shows curves to explain the method of operation of the circuit according to FIG. 1 using the said voltage peaks whose polarity has been changed, that is to say has been reversed to be positive.
Figure 3:
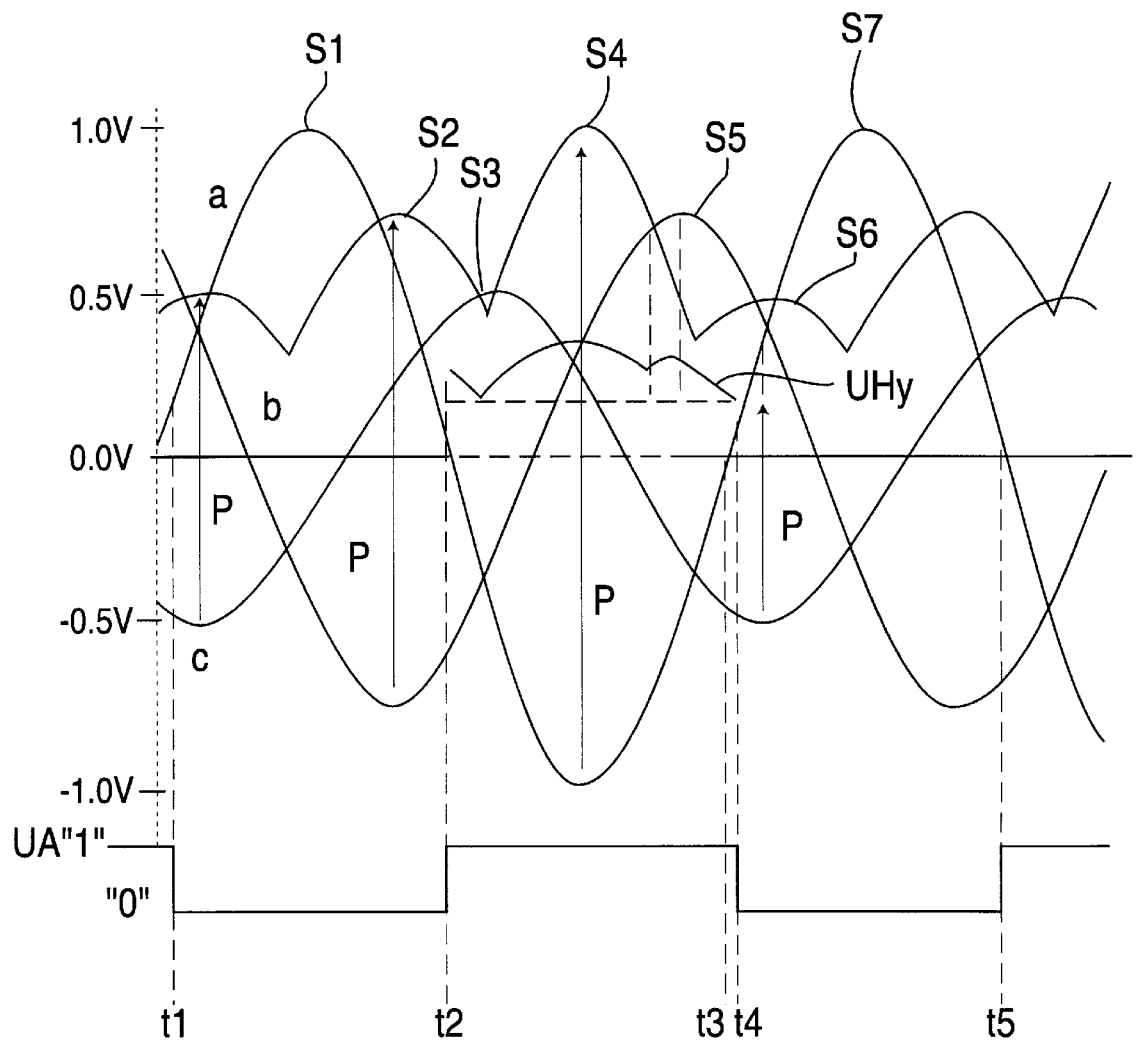

In this case, the lower-case letters indicate the points in the circuit in FIG. 1 at which the signals according to FIGS. 2, 3 are present.

DETAILED DESCRIPTION OF INVENTION

According to FIGS. 1, 2, three signals a, b, c, which come from three sensors, are identical and are mutually phase-shifted through 120° are in each case supplied via the resistors 1, 2, 3 to the negative inputs of the comparators A, B, C. The signals a, b, c are additionally supplied to the diodes Da, Db, Dc which form an OR stage. Their junction point d, which forms the output of the OR stage, is in each case connected via resistors 4, 5, 6 and switches Sa, Sb, Sc to the positive inputs of the comparators A, B, C, which are in turn connected via resistors 7, 8, 9 to a constant reference-earth voltage (reference), such as earth for example.

The comparators A, B, C produce digital output voltages UA, UB, UC having the two possible states "0" and "1". Via lines La, Lb, Lc, these voltages UA, UB and UC also control the switches Sa, Sb, Sc.

The method of operation of the circuit according to FIG. 1 will be explained with reference to FIG. 2. FIG. 2 shows the sinusoidal sensor signals a, b, c which are mutually phase-shifted through 120° and are of equal amplitude. The signal having the greatest amplitude is in each case present at the point d. The waveform as shown by the highly emboldened curve is thus produced for the point d. The operation for sensor signal a at the comparator A will be explained in the following text. Until the time t1, the signal a is below the hysteresis level. Since the signal a passes to the negative input of the comparator A, UA is in the logic state "1". At the same time, it is initially assumed that the switch Sa is open and that the positive input of the comparator A is thus at zero potential. The signal a reaches the hysteresis voltage at time t1. In consequence, UA assumes the state "0". The solid line Sa indicates that that switch Sa is closed, and the dotted line indicates that the switch SA is open. Sa is thus open from t1 until t2 and the zero line for the response of the comparator A is thus exactly at 0 volt. At time t2, the signal a passes through the zero line again and assumes a negative value. In consequence, the value of UA changes from "0" to "1" again. This change takes place exactly at the zero crossing, because the switch Sa is still open, the positive input of the comparator A is at zero potential and, therefore, there is no hysteresis. The switch Sa closes at time t2. The positive input of comparator A thus assumes a positive voltage value of voltage d, depending on the value of the resistors 4 and 7 and on the amplitude of the sensor signal. There is thus an offset in the zero line of the comparator A, as is illustrated by the offset zero line 0'. The zero line at which the comparator A responds is thus now shifted. The next response of the comparator A, that is to say the changeover of UA from "1" to "0", now therefore does not take place at the time t3, where the signal a crosses the zero line, but when the signal a intersects the offset zero line 0'. As can be seen, this results in single-sided hysteresis in UA switching back. Single-sided means that the changeover point is not shifted into + and −, but only to +. When the signal changes from + to −, the changeover therefore takes place ideally at the zero value, namely at t2 for example, but when the signal changes from − to +, the changeover no longer takes place at the zero value, but is delayed in the manner described.

Since the amplitude of the signals a, b, c is of equal size, these conditions apply to all three signals a, b, c. If it is now assumed that the hysteresis, represented by UHy, assumes a specific percentage of the sensor signal, this results in it no longer being possible for the superimposed interference having a smaller percentage than the hysteresis to pass the circuit, irrespective of the amplitude of the sensor signal.

The circuit can also be designed such that it responds to the negative voltage peaks, if the polarities of the diodes Da, Db and Dc are reversed. In FIG. 2, the zero line from t1 to t2 would then be shifted into the negative area and, in contrast to FIG. 2, would be exactly 0 from t2 to t3. A combination of the evaluation of the positive and negative peaks is also possible. Hysteresis which is symmetrical with respect to the zero line can then be achieved.

FIG. 2 also shows the following special feature. The negative peaks of the signal b, which extend to −1.0 volt, have their polarity changed, as is illustrated by the arrow P, that is to say they are folded upwards to a certain extent. As can be seen, the negative peaks of the signal b are now located between the peaks of the voltage d at the output of the said OR stage. The advantage of this is that more voltage peaks are now available per unit time, and the notch between the voltage peaks is smaller. In the case of this arrangement, the peaks of the voltage d and the peaks, located in between, of the voltages whose amplitude has been folded over are supplied to a further OR stage. This results in the advantage that the hysteresis voltage UHy is smoothed better, that is to say has fewer notches. When split in a corresponding manner in amplitude, the waveform of UHy corresponds to the waveform of the voltage d.

FIG. 3 shows three sensor signals, a, b, c, which have different amplitudes, rather than the same amplitudes as in FIG. 2. The signal a is at 100% of the maximum amplitude, b at approximately 75%, and c at approximately 50%. As described with reference to FIG. 2, the negative peaks of all the signals a, b, c, as illustrated by the arrows P, are also folded upwards in FIG. 3. The negative polarity is converted to positive polarity by a circuit for polarity reversal. The originally positive peak S1 of the signal a which is at 100% amplitude, the peak S2, which has been folded over to be positive, of the signal b, the originally positive peak S3 of the signal c, the folded-over peak S4 of the signal a, the originally positive peak S5 of the signal b, the folded-over negative peak S6 of the signal c and the originally positive peak S7 of the signal a and so on, follow one another alternately. The illustrated hysteresis voltage UHy follows the curves with the peaks S2, S4, S5, successively, split in a corresponding manner in amplitude. As can be seen, the folding over of the negative voltage peaks to the positive region produces additional peaks in the case of such signals having different amplitudes, and the notches between the peaks are reduced. With respect to the change in the hysteresis as a result of the voltage on the output of the OR stage, the circuit according to FIG. 1 would also operate in the manner described with the signal according to FIG. 3.

In a development of the invention, the sum of two mutually phase-shifted sensor signals of separate sensors is supplied to an input of a comparator for the output voltages of a sensor. Outputs of different sensors are preferably in each case directly connected to one another. In the case of an arrangement of n sensors, one output of a sensor is in each case connected to one output of the next sensor, and one output of the last sensor is then again connected to one of the outputs of the first sensor. It is not absolutely essential for the outputs to be directly connected to one another in order to achieve the desired effect, that is to say to be short-circuited. This depends on the signal which is in each case supplied to one input of a comparator being composed of the signals from two outputs from two separate sensors. It is also possible to supply the signals from two outputs of separate sensors to an adder stage or a subtraction stage and to connect the output of this stage in each case to the corresponding input of the comparator. This solution has the advantage that the two added or subtracted signals are intrinsically retained and are not intrinsically lost, as in the case of a short-circuit. The sensors are preferably designed as Hall elements which respond to the influence of a magnetic field. The sensors are preferably used to detect the angular position of the rotor of an electric motor for commutation or rotation-speed regulation, for example of the capstan motor in a video recorder.

This solution results in a number of advantages. As a result of the fact that two outputs of separate sensors are in each case combined to form one output, the total number of outputs of all the sensors is halved. If the sensors are now arranged on an IC, the number of connecting pins or pins required on the IC is in consequence halved. This is particularly advantageous, in practice, with regard to the production of the IC and the utilization of space. The following advantageous effect is achieved with regard to interference suppression. If, for example, current is passing through a coil in a motor which contains the sensors, crosstalk occurs onto all, preferably three, sensors. In consequence, one sensor receives the crosstalk in the positive direction, and another sensor receives it in the negative direction. By combining output voltages of different phase from separate sensors, for example short-circuiting the outputs, the components of the crosstalk are compensated for at the output, which is now common to both sensor outputs. For example, the first comparator receives crosstalk from the first sensor and crosstalk in a different phase from the second sensor. In this way, crosstalk signals are compensated for by the vectorial addition of interference voltage components, which preferably have a phase shift of 120° with respect to one another. Nevertheless, the signals at the outputs of the comparators are once again in the correct phase relative to the sensor signals at the outputs of the sensors.

Figure 7:
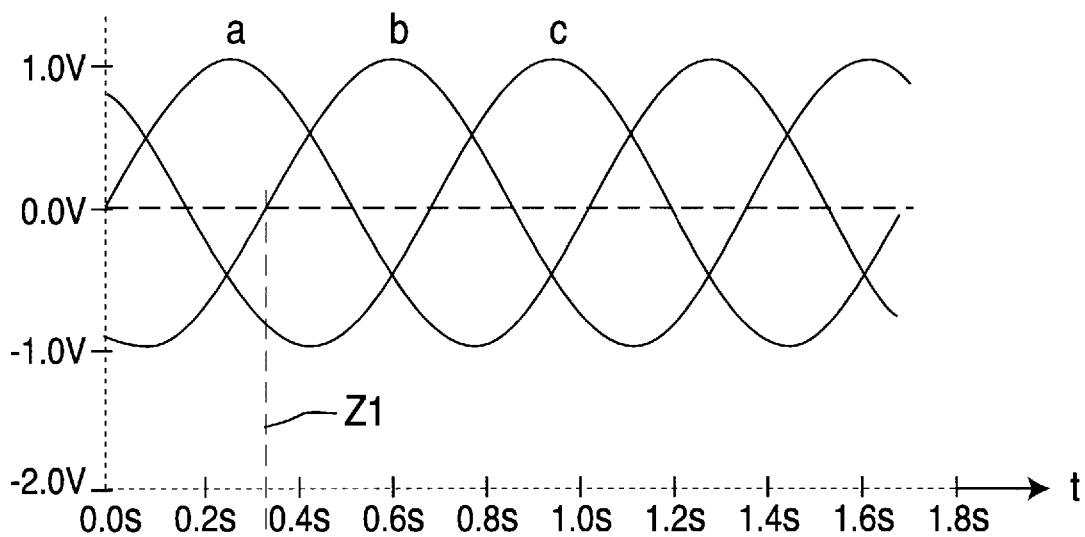
Figure 8:
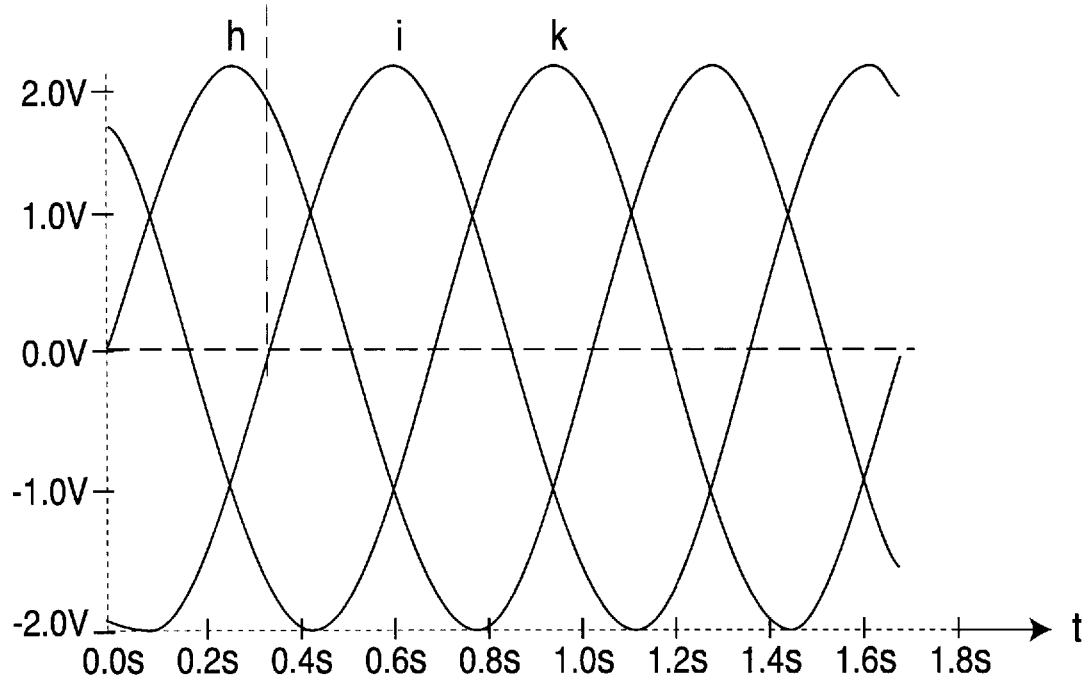

This development is explained in the following text with reference to the Figures, in which:

FIG. 4 shows a known evaluation circuit for three sensors,

FIG. 5 shows an evaluation circuit designed according to the invention,

FIG. 6 shows a table for the signals which are illustrated in FIG. 5,

FIGS. 7–8 show curves in order to explain FIG. 4, and

Figures 9, 10, 11:
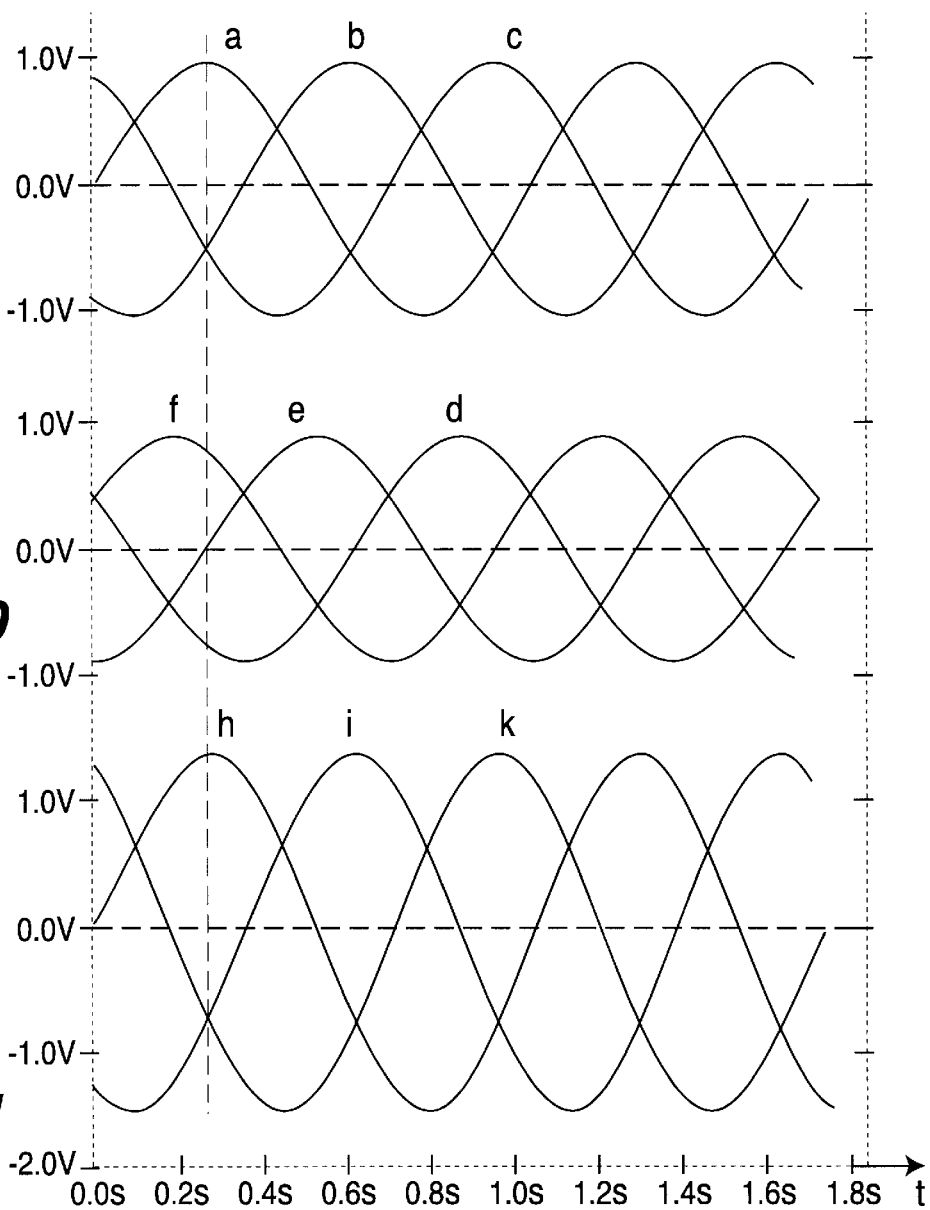
Figure 12:
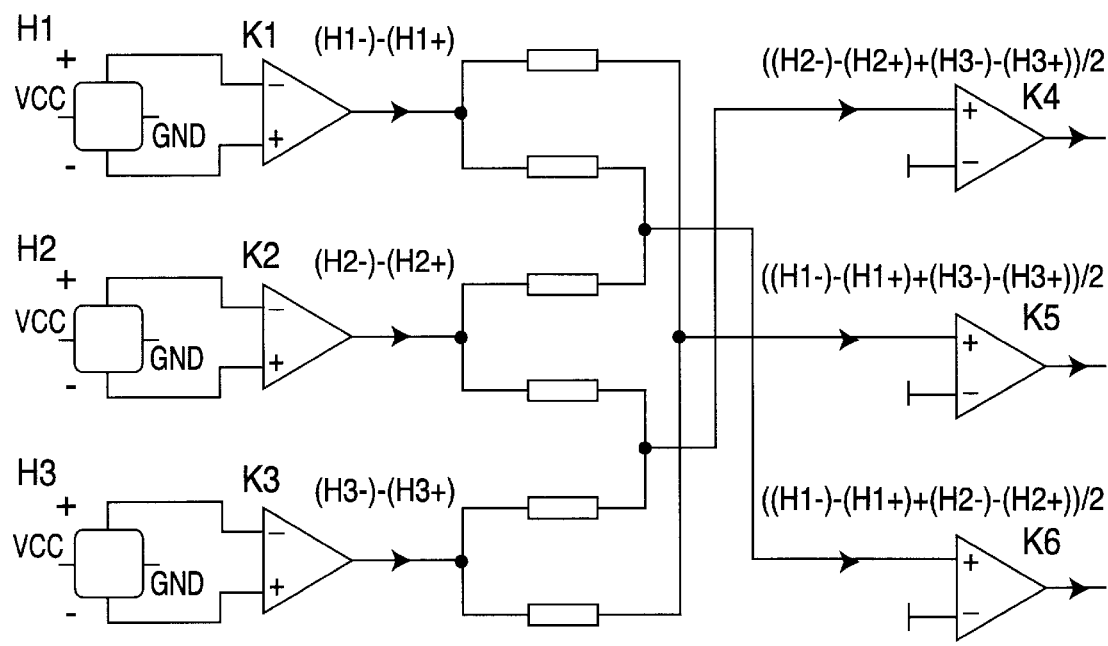
Figure 13:
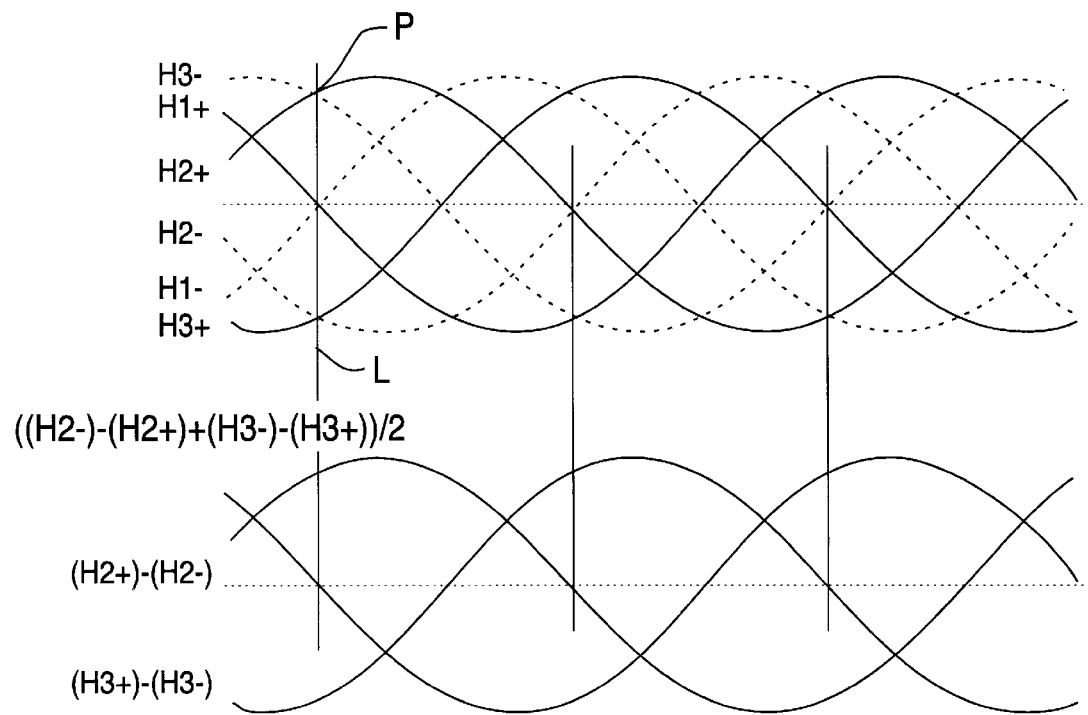
Figure 14:
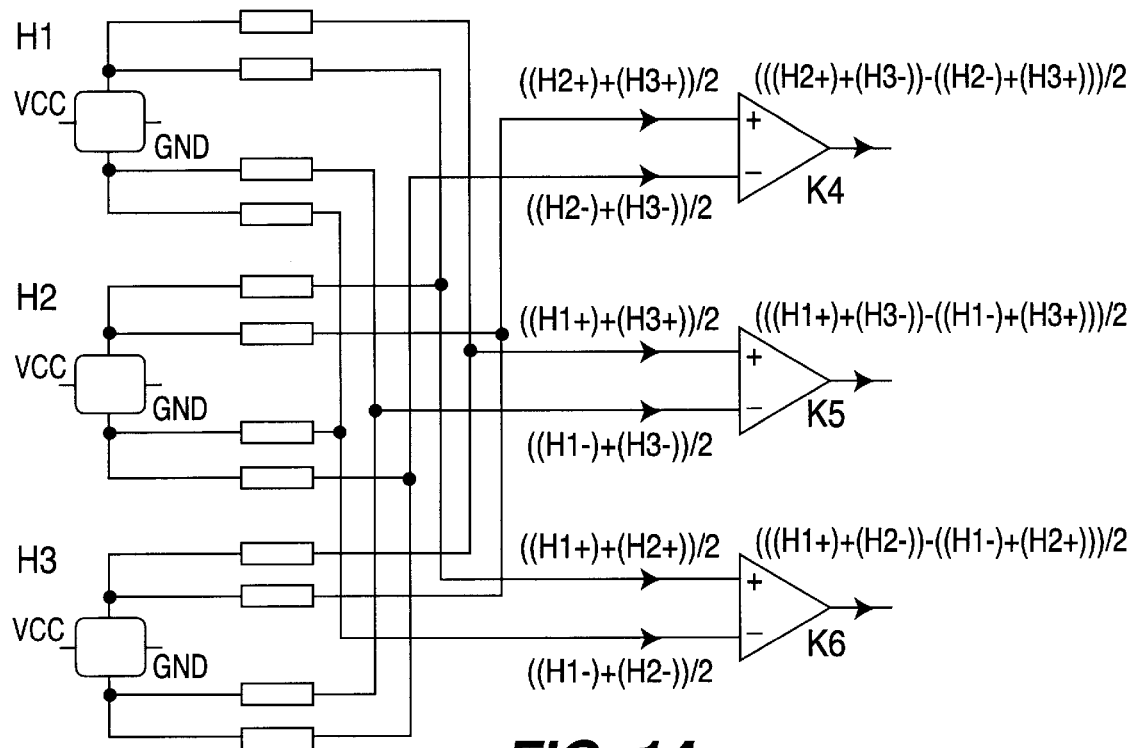
Figure 15:
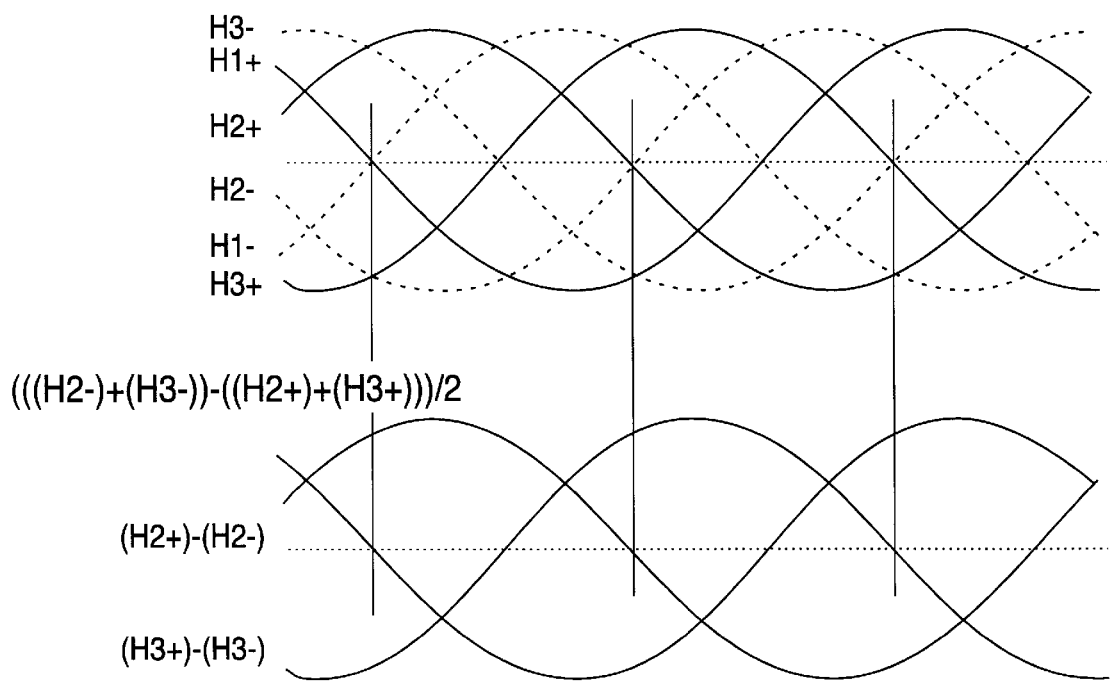
Figure 16:
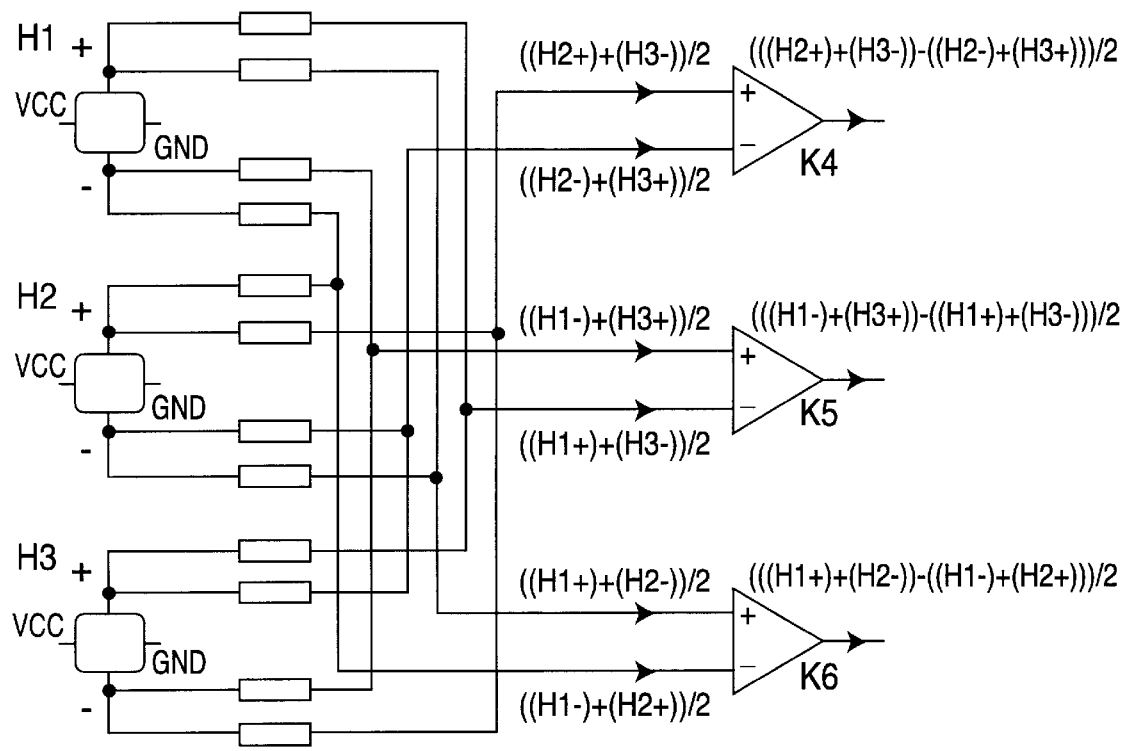
Figure 17:
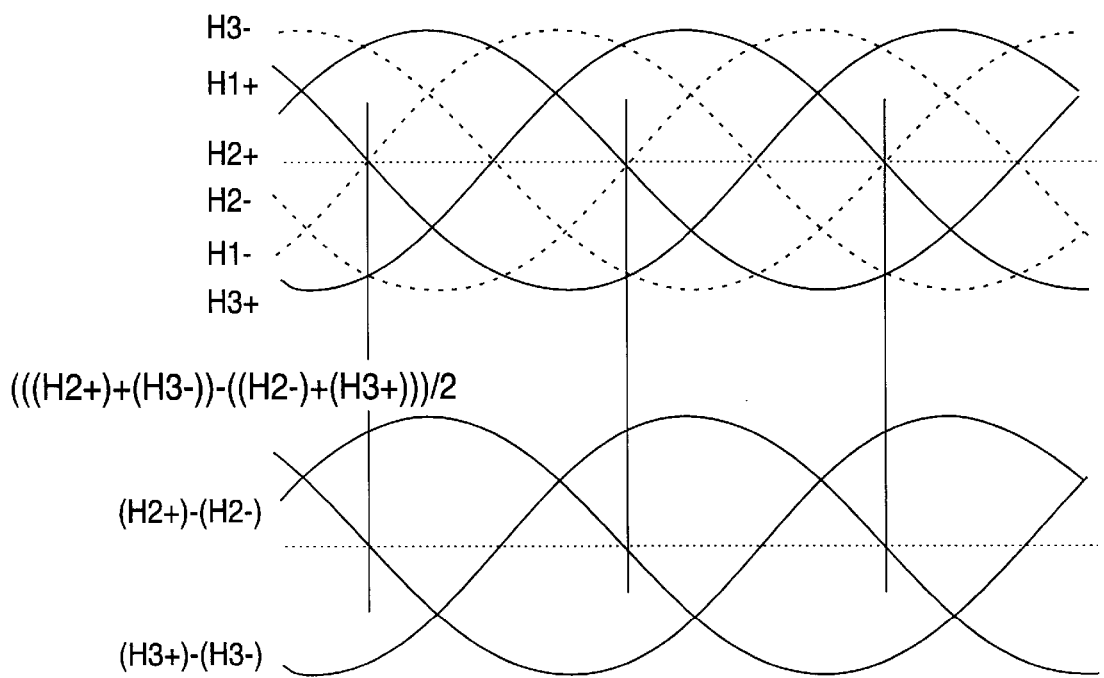

FIGS. 9–11 show curves to explain the circuit according to the invention as in FIG. 5, FIG. 12 shows a circuit variant for a development, FIG. 13 shows curves to explain the method of operation of the circuit according to FIG. 12, FIG. 14 shows a further circuit for the development, FIG. 15 shows curves to explain the method of operation of the circuit according to FIG. 14, FIG. 16 shows a further modification of the circuit and FIG. 17 shows curves to explain the method of operation of the circuit according to FIG. 16.

In this case, the lower-case letters a–k indicate the points in FIGS. 4, 5 in which the signals as in FIGS. 7–11 occur. The meanings of the symbols used in FIG. 6 are as follows.

H1+ Sensor signal at the positive output of the sensor H1
H1– Sensor signal at the negative output of the sensor H1
H2+ Sensor signal at the positive output of the sensor H2
H2– Sensor signal at the negative output of the sensor H2
H3+ Sensor signal at the positive output of the sensor H3
H3– Sensor signal at the negative output of the sensor H3

FIG. 4 shows three sensors H1, H2, H3 which are designed as Hall elements and are in each case illustrated in the form of resistors in the form of a bridge circuit. Each sensor has a positive output with the signal V+ and a negative output with the signal V–. The output signals V+ and V– of the sensors H1–H3 are in each case supplied to the inputs of three differential amplifiers K1, K2, K3, which supply the illustrated signals at their outputs h, i, k. In digital applications, the differential amplifiers K1–K3 can be replaced by comparators.

FIG. 7 shows the signals a, b, c at the positive outputs of the sensors H1, H2, H3, which have the same amplitude and are mutually phase-shifted by 120°. The corresponding antiphase sensor signals V–, shifted through 180°, are not illustrated in FIG. 7, for the sake of simplicity.

FIG. 8 shows the output signals h, i, k which result from this at the outputs of the comparators K1, K2, K3, and these signals have twice the amplitude of the signals according to FIG. 7, because of the double negation. As is indicated by the vertical dashed line Z1, the signals as in FIGS. 7, 8 are in phase. This circuit cannot suppress interference which reaches the sensors as a result of magnetic crosstalk from coils of a motor.

In FIG. 5, the outputs of the sensors H1, H2, H3 are connected to one another, that is to say short-circuited, by the illustrated lines. The overall arrangement of the sensors now has only three outputs d, e, f, which are passed via the lines L1, L2, L3, L4 to the corresponding inputs of the comparators K1, K2, K3, the lines L1 and L4 carrying the same signal.

FIG. 6 shows the signals which result in FIG. 5. Since the outputs of the sensors H1, H2, H3 have the same output impedances, that is to say the sensor signal of a sensor is halved by the output impedance of this sensor and the output impedance of the sensor connected to it, half the sum of the sensor signals from the two sensors which are connected to one another is in each case produced at the output. As can be seen, each signal at the inputs of the comparators K1–K3 is composed of two sensor output signals. As can also be seen, the output signals h, i, k at the outputs of the differential amplifiers K1–K3 are always composed of signal components from all three sensors H1, H2, H3. In this case, the mathematical signs are such that interference from the three sensors H1, H2, H3 is self-cancelling at the comparators, without the wanted signals being adversely affected in so doing.

FIG. 9 once again shows the signals a, b, c as in FIG. 7. FIG. 10 shows the signals e, f, d resulting therefrom, as in FIG. 5. As can be seen, a phase shift occurs between the signals as in FIG. 9 and the signal as in FIG. 10, by vectorial addition of sensor signals of separate sensors. The zero crossings of the signals are thus shifted with respect to one another, as a comparison of FIG. 9 and FIG. 10 shows.

FIG. 11 shows the output signals i, h, k at the outputs of the differential amplifiers K1, K2, K3. The amplitude of these signals is in this case irrelevant since only the zero crossings are evaluated. As can be seen, the zero crossings of the signals in FIG. 11 are at the correct phase angle with respect to the signals in FIG. 9, again. Thus, when the zero crossings are detected, only the sensor signal of the sensor assigned to the comparator is evaluated at each output of the differential amplifiers, despite the combination of the sensor signals.

If the signals of the sensors H1, H2, H3 have different amplitudes or different internal impedances, distortion can occur in the output signals which are produced, particularly if the Hall elements have a so-called offset. Variants which, in particular, avoid such discrepancies arising from an offset, are described with reference to FIGS. 12 to 17.

The principle of the method of operation of the said development will be described first, with reference to FIG. 13. The upper part of FIG. 13 once again shows the signals of the sensors H1, H2, H3, to be precise for both polarities. The solid line in each case shows the positive signal and the dotted line the negative signal, which, in the case of one sensor, are in each case shifted through 180°. The addition, for example, of H3– and H3+ in each case once again produces a sine wave having the same zero crossings. Only the zero crossing of one signal, for example for the switching-on of the next coil in the case of a motor, is in each case evaluated. The amplitude of the signals is thus irrelevant for the evaluation. It is now intended to consider the first zero crossing of the signal H1+, which is marked by the line L. As can be seen, the signals H3– and H2+ intersect at the point P in the case of this zero crossing, that is to say they have the same amplitudes. The first zero crossing of H1+ can thus also be derived from the criterion that the signals H2+ and H3– of the two other sensors have the same amplitude. This means that the signal of this sensor is not required at all for the production of the actual output signal of a sensor, but can be replaced by the signals from two other sensors. It is thus possible to evaluate the zero crossing for a sensor without having to use the signal of the sensor itself for this purpose. The signals from two other sensors are used instead. However, these signals have a significant amplitude during the said zero crossing of the first sensor.

The circuits which are illustrated in FIGS. 12, 14 and 16 and are supplemented by equations are now designed such that the output signal of a sensor is in each case composed only of output signals of the other sensors in each case, that is to say no longer contains the actual output signal of its own sensor at all. The illustrated differential amplifiers K4, K5, K6, which are assigned to the sensors H1, H2, H3, thus each receive only signals of the other sensors. FIG. 12 shows that the differential amplifier K4, which supplies the output signal of the sensor H1, receives only signal components of the sensors H2 and H3. The comparator K5 for the sensor H2 likewise receives only signal components of the sensors H1 and H3, and the comparator K6 for the sensor H3 receives only signal components of the sensors H1 and H2.

FIG. 13 shows that the sum of the signals H2+ and H3+ likewise produces zero at the zero crossing of H1+ and can thus likewise be evaluated. This variant is illustrated in FIG. 14. It is likewise possible to add the signals H2– and H3–. This sum likewise produces the value zero at the zero crossing of H1+ in FIG. 13.

The described development of the invention has the following advantage. The sensors, in particular the Hall elements, can have an offset. This offset is of equal magnitude for the "+" output and the "–" output. As FIG. 12 and FIG. 14, in particular, show, the equations at the outputs of the differential amplifiers K4, K5, K6 each contain signal components of the other sensors of opposite polarities, that is to say, for example, H2+ and H2– and H3+ and H3– at the output from K4. Since the offset at the "+" outputs and "–" outputs is always of the same magnitude, this leads in an advantageous manner to compensation for the intrinsically interfering offset.

Since, according to the invention, a third sensor signal is generated from two sensor signals, it is possible to use only two sensors overall. One sensor would then be saved. A first signal can then be obtained in a known manner from the first sensor, a second signal in a known manner from the second sensor, and the third signal by the combination according to the invention of the output signals of the two sensors.

In the case of a development of the invention, the interference field, which originates in particular from the stator coils, at the sensor is not significantly reduced. The wanted signal which originates from the permanent magnets of the rotor is, however, increased by the influence of the lines of force. Overall, this leads to an increase in the signal to noise ratio at the sensor.

This solution is in this case based on the knowledge that the magnitude of the magnetic lines of force reaching the Hall sensor from the permanent magnets can be significantly increased purely by shaping the permanent magnet at the edge facing the sensor. A major advantage is that no additional parts are necessary for this increase in the wanted signal. The advantageous effect is achieved merely by a modified shape of the permanent magnets on their side facing the sensor. The effect of the permanent magnets in terms of the motor drive is in practice not adversely affected by this. Thus, all that is required for the production of the permanent magnets is a slightly modified tool.

Figure 18:
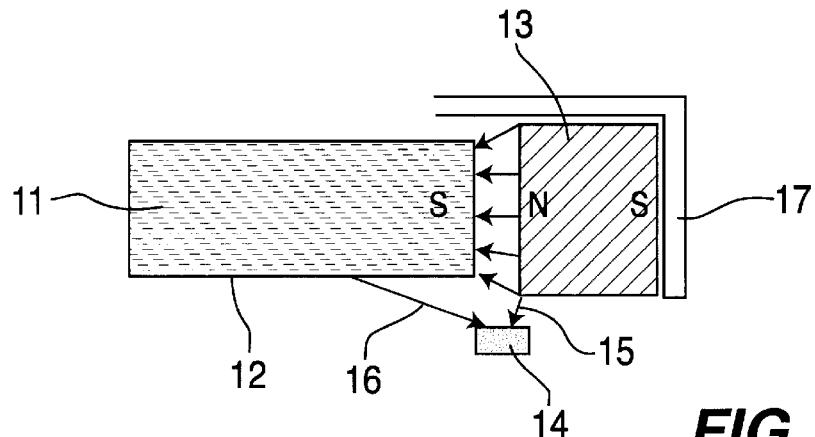
Figure 19:
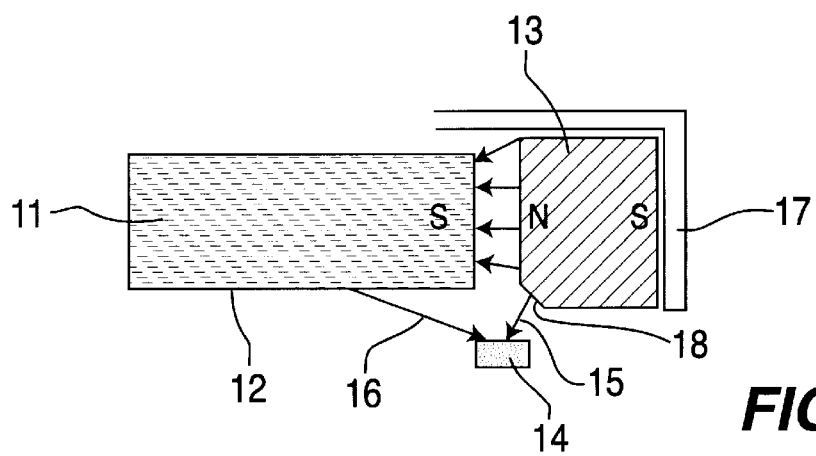
Figure 20:
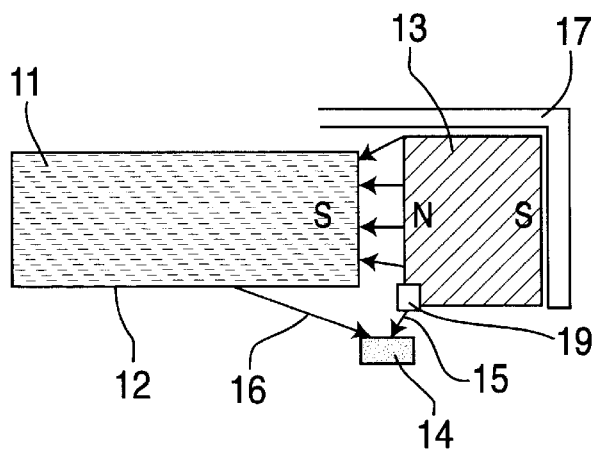
Figure 21:
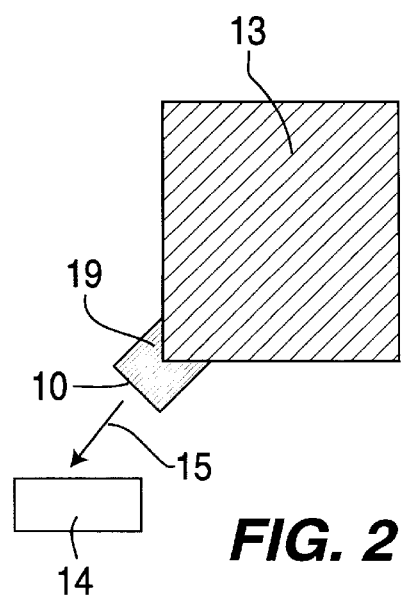

This solution is explained in the following text with reference to FIGS. 18–21, in which FIG. 18 shows a known arrangement of a Hall sensor inside a motor, FIG. 19 shows a design according to the invention of the arrangement according to FIG. 18, FIG. 20 shows another design according to the invention, and FIG. 21 shows a detail from the arrangement according to FIG. 20.

FIG. 18 shows a stator pole 11, a large number of which are arranged in the form of a star on the stator of the motor.

Each stator pole 11 is surrounded by a winding 12, which forms the actual coil for driving the motor. The winding 12 is fed with a commutation current. The rotor contains a ring 13, which is illustrated only in section. The ring 13 contains radially polarized permanent magnets, whose polarity is alternately opposite along the circumference and which, together with the corresponding north and south poles of the stator brought about by the commutation of the coil, produce the drive for the motor. Furthermore, a magnetic return path plate 17 is shown. The Hall sensor 14 is provided on the stator, that is to say in a stationary manner on the motor housing. This Hall sensor 14 is acted on by the stray flux from the magnetic lines of force 15 of the permanent magnets of the ring 13 and in consequence produces at its output a control signal which indicates the respective position of the rotor containing the ring 13. This control signal is preferably used for speed regulation or commutation. In addition, a magnetic interference field 16, which reduces the signal to noise ratio in the output signal of the sensor 14, acts on the Hall sensor 14 from the coil 12. This can lead to uneven running of the motor, with a torque which is less than the maximum possible.

FIG. 19 once again shows the parts 11–17 from FIG. 18. The difference from FIG. 18 is that the edge, facing the Hall sensor 14, of the ring 13 is not of rectangular design as in FIG. 18, but is provided with a chamfer 18. Since magnetic lines of force emerge essentially at right angles from the permanent magnet, the magnitude of the magnetic lines of force which reach the sensor 14 from the magnets of the ring 13 is significantly increased in comparison with FIG. 18. The chamfer 18 is preferably at right angles to a connecting line between the sensor 14 and that edge of the ring 13 which faces the sensor 14.

FIG. 20 once again shows the parts 11–17 from FIG. 18. The difference from FIG. 18 and FIG. 19 is that the edge, facing the Hall sensor 14, of the ring 13 is not designed at right angles, as in FIG. 18, or with a chamfer 18 as in FIG. 19, but is provided with a projection 19. This projection 19 can be an annular attachment on the side facing the Hall sensor 14, which attachment extends over the entire circumference of the ring 13 and is directed towards the sensor 14, such that it is in the immediate vicinity of said sensor 14.

FIG. 21 shows a detail from FIG. 20, somewhat enlarged. The projection 19, which is likewise designed as a circumferential ring, is placed on the ring 13. The projection 19 is once again magnetized together with the ring 13 in such a manner that the ring 13 and the projection 19 have a large number of permanent magnets which are polarized in the radial direction and follow one another with alternately opposite polarity in the circumferential direction. The projection 19 has a surface 10 which is directed towards the Hall sensor 14 and is approximately at right angles to the connecting line between the projection 19 and the Hall sensor 14. The projection 19 can extend into the immediate vicinity of the Hall sensor 14 and, to a certain extent, forms a magnetic pole which is directed towards the Hall sensor 14 and by means of which the said permanent magnets act on the Hall sensor 14.

We claim:

1. Control circuit for producing output voltages (UA, UB, UC) from a plurality of sensor signals (a, b, c) each signal in said plurality being identical and mutually phase shifted, said circuit comprising:

a plurality of comparators (A, B, C) for producing said output voltages (UA, UB, UC) wherein each comparator of said plurality of comparators is respectively supplied with one of said plurality of sensor signals (a, b, c) and with an amount of hysteresis which depends on the amplitude of one or more of the respective other sensor signals;

circuit means for deriving the respective amount of comparator-hysteresis for each said comparator from the amplitude of one of more of the respective other sensor signals (a, b, c); and a switch (Sa. Sb, Sc) uniquely associated with each comparator, which is operated by the output voltage (UA, UB, UC) of the comparator (A, B, C), wherein said switch is located between the output of an OR stage and an associated input of the comparator (A, B, C).

2. The circuit according to claim 1, wherein the sensor signals (a, b, c) are supplied to the OR stage (Da, Db, Dc) which responds to the positive and/or negative peak values of the sensor signals, said OR stage having an output voltage (d) applied to the inputs of the comparators (KA, KB, KC), which inputs determine the hysteresis.

3. The circuit according to claim 2, wherein each said comparator has two inputs, and wherein the sensor signal (a, b, c) coming from a sensor and the output voltage (d) of the OR stage are in each case applied to the two inputs of the comparator (A, B, C).

4. Control circuit for producing output signals (h, l, k) from pairs of antiphase signals (V+, V−) each said pair being identical and mutually phase shifted, said antiphase signals generated in pairs by a plurality of sensors (H1, H2, H3) comprising:

comparators (K1, K2, K3) for producing said output signals (h, l, k) whereby an inverting (−) and a noninverting (+) input of each comparator (K1, K2, K3) is supplied with one pair of antiphase sensor signals (V+, V−) as well as with one sensor signal of the respective other pairs of antiphase sensor signals (V+, V−); and means (L1, L2, L3) for connecting the inverting (−) and the noninverting (+) input of each comparator (K1, K2, K3) with outputs (d, e, f) of the sensors (H1, H2, H3) which outputs (d, e, f) are constituted by connecting one output of each sensor (H1, H2, H3 with one output of another sensor (H1, H2, H3).

5. The circuit according to claim 4 wherein a zero crossing of the output signal of a sensor (S1) is derived from the criterion that the output signals of two other sensors (S2, S3) have the same amplitudes, the signal path for one sensor (H1) in each case containing a differential stage (K4–K6) which is fed only with the output signals from two other sensors (H2, H3).

6. The circuit according to claim 4, wherein only two sensors are used, and wherein a first signal is produced by the first sensor, a second signal is produced by the second sensor, and a third signal is produced by comparison of the first and second signals of the first sensor and of the second sensor.

7. The circuit according to claim 4, wherein the outputs of two separate sensors are in each case connected to the inputs of an adder stage or of a subtraction stage whose output is connected to an input of a differential stage.

8. The circuit according to claim 4, wherein each said produced output signal (h, l, k) includes a signal component associated with each sensor (H1, H2, H3).

* * * * *